(12) United States Patent
Valeriiovych

(10) Patent No.: US 11,905,757 B2
(45) Date of Patent: Feb. 20, 2024

(54) PHOTOELECTRIC WINDOW BLINDS

(71) Applicant: Erik Yevgen Valeriiovych, Kiev (UA)

(72) Inventor: Erik Yevgen Valeriiovych, Kiev (UA)

(*) Notice: Subject to any disclaimer, the term of this patent is extended or adjusted under 35 U.S.C. 154(b) by 447 days.

(21) Appl. No.: 17/621,076

(22) PCT Filed: Jan. 28, 2020

(86) PCT No.: PCT/UA2020/000007
§ 371 (c)(1),
(2) Date: Dec. 20, 2021

(87) PCT Pub. No.: WO2020/159467
PCT Pub. Date: Aug. 6, 2020

(65) Prior Publication Data
US 2022/0349248 A1 Nov. 3, 2022

(30) Foreign Application Priority Data

Jan. 29, 2019 (UA) ............... a 2019 00923

(51) Int. Cl.
E06B 9/303 (2006.01)
H02S 40/32 (2014.01)
(Continued)

(52) U.S. Cl.
CPC .............. *E06B 9/303* (2013.01); *E06B 9/322* (2013.01); *E06B 9/386* (2013.01);
(Continued)

(58) Field of Classification Search
CPC .......... E06B 9/303; E06B 9/322; E06B 9/386; E06B 2009/2476; H02S 40/32; H01L 31/0504
See application file for complete search history.

(56) References Cited

U.S. PATENT DOCUMENTS

| | | | | |
|---|---|---|---|---|
| 2011/0048656 A1* | 3/2011 | Chu | ........................ | H02S 40/36 160/310 |
| 2015/0101761 A1* | 4/2015 | Moslehi | .................. | E06B 9/386 160/107 |
| 2018/0204967 A1 | 7/2018 | Hall et al. | | |

FOREIGN PATENT DOCUMENTS

| | | |
|---|---|---|
| DE | 10344213 A1 | 7/2005 |
| DE | 102007001726 A1 | 7/2008 |

(Continued)

*Primary Examiner* — Kourtney R S Carlson
(74) *Attorney, Agent, or Firm* — Sisson & Banyas, Attorneys at Law, LLC; Jeffrey J. Banyas

(57) ABSTRACT

Photoelectric window blinds, which consist of a plurality of elongated lamellas, which are arranged in parallel and connected between each other by at least two stripes, equipped with a drive for their assembling, disassembling and changing an inclination angle, on which solar panels are mounted, the panels being connected between each other and equipped with a means for transmission of an obtained electric energy to external networks or to a means for storage. According to the invention, each solar panel is formed by at least two sections of solar elements, which are arranged on a base made of an electrically insulating material and covered by a temperature and moisture stable layer, coupled to each other and by a means for electrical connection embedded therein, and it is configured to receive at least one additional section. An edge section of each solar panel is equipped with a means for transformation of an output power, the means being a DC/DC transformer or a Schotky diode embedded into the base made of the electrically insulating material from a side of the panel faced towards the lamella, and coupled to a shared bus that is connected to a DC-to-AC current transformer. Therewith, a cross-section profile of the lamellas has a C-shape with curved edges, which form guides for mounting the solar panels in a longitudinal direction, wherein a distance between edges of (Continued)

the sections of the solar elements of the solar panel and edges of the electrically insulating base equals to a width of the edges of the lamella guides.

8 Claims, 4 Drawing Sheets

(51) Int. Cl.
    *E06B 9/322*     (2006.01)
    *E06B 9/386*     (2006.01)
    *H01L 31/05*     (2014.01)
    *E06B 9/24*     (2006.01)

(52) U.S. Cl.
    CPC .. *H01L 31/0504* (2013.01); *E06B 2009/2476* (2013.01); *E06B 2009/3222* (2013.01); *H02S 40/32* (2014.12)

(56) References Cited

FOREIGN PATENT DOCUMENTS

| | | |
|---|---|---|
| DE | 102008014561 A1 | 9/2009 |
| WO | 2017175946 A1 | 10/2017 |

\* cited by examiner

PHOTOELECTRIC WINDOW BLINDS

CROSS REFERENCE TO RELATED APPLICATION

This patent application claims the benefit and priority of Australian Patent Application No. PCT/UA2020/000007 filed on 28 Jan. 2020 and Ukrainian Patent Application UAA201900923 filed on 29 Jan. 2019, the teachings of each of which are incorporated by reference herein in their entirety as part of the present application.

FIELD OF THE INVENTION

The invention relates to the field of comfort enhancement and energy saving in buildings, in particular, to selective devices, which combine functions of regulation of penetration of solar light to rooms with its simultaneous accumulation and transformation into electric energy, namely, to window blinds directed towards the sun, which have surfaces provided with solar panels.

PRIOR ART

At present, there are many solutions known, which relate to a combination of transmission of daylight into a room, thereby generating a solar energy by mounting solar panels on a building, in particular, into window apertures in order to collect the solar energy and its transformation into the electric one.

The concept of combination of the solar panels with a means for regulating the passage of the light into the room such as shutters, curtains, roller doors, also finds development in the energy supply of buildings.

One of such solutions is disclosed in the patent DE102007001726 dated Jul. 17, 2008, which describes blinds that consist of plates, which cover one another and have an outer surface with a semiconductor layer of a solar element applied thereon, the element producing the energy, the plates are connected by means of flexible conductors with a cable that is connected in turn to a contact rail through which the energy is transferred into an accumulating means and from which it may be spent to supply small household appliances, in particular, lamps.

A drawback of said solution lies in that the use of said panels is not reliable in view of their vulnerability to deforming impacts when using them as blinds, since the solar elements form lamellas that also limits a possibility of their use only in an internal space of the room, since it does not imply a protection from external environmental impacts. Removal and transportation of the energy from such blinds are difficult, since in spite of the fact that the maximum area directed towards the sun is covered by the solar element and in fact does not have gaps in case of solid closure, a period of its usage is defined only by a period of time when the sun is shining directly to the panels, while in a different time the energy generated by a photoelement is not sufficient for its collection and accumulation. Furthermore, a cumbersome system of conductors and cables makes regulation and setting of said blinds more difficult for more effective usage and energy production, thus, said blinds substantially perform their main function that lies in regulation of the illumination level in the room.

Said drawbacks are partially resolved in the application WO2017175946 A1 dated Oct. 12, 2017, which discloses a solution regarding use of an area of lamellas of blinds in order to arrange solar modules. Said module is represented by blinds, which consist of elongated lamellas, which may receive the solar elements, thereby forming panels, which are electrically connected between each other and equipped with a means for transmission of an output power of the produced electric energy onto external means for storage or distribution of the electric energy, thereby forming a photoelectric blind module. The lamellas are preferably mounted in parallel one relative to another with a possibility of simultaneous pivot so as one of said lamellas moves in an angular range from a closed position for blocking a passage of solar beams through the window and an opened position, wherein a maximum amount of solar light may pass into the room, and are connected between each other by at least two supporting stripes. An output end of the photoelectric module is associated with an input end of the means for transmission of the output power, namely, by a controller having an output end that is connected to an input end of the unit for energy storage and distribution.

A drawback of said solution lies in a number of problems associated with a need in manufacture the solar elements of a certain length without a possibility to change it with no damage of the panel, which inhibits effective usage of the area of the lamellas, leads to additional expenses for conducting materials. Therewith, use of a single controller as the means for transmission of the output power causes losses of the electric energy when collecting and transporting the same to a shared network and does not provide a required level of safety in terms of a voltage value in a system for transforming the electric current received from the panels.

Therefore, development of more effective photoelectric blinds, which accounts for and overcome the drawbacks of the prior art to the fullest extent, is actual at present.

SUMMARY OF THE INVENTION

In view of the above-mentioned, a technical aim of the claimed invention is to provide a stability of a structure for up to wide range of environmental impacts, a possibility of easy change of length of the panels and mounting blinds having individual dimensions for buildings, which already exist, while using the area of the lamellas in an effective way in order to collect the solar irradiation, to provide a regulatory level of safety in terms of the voltage value in a system for transforming the electric current received from the panels and to reduce the consumption of the current on the ways of its transportation to the shared network.

A technical effect being achieved lies in providing high characteristics of mechanical rigidity, while enabling to manufacture and mount the blinds in a wide range of dimensions, preserving an effective functional area for collection of the solar irradiation, reducing expenses for transformation and transportation of the electric energy to the shared network, while providing a regulatory level of safety in terms of the electric voltage value.

The stated problem is solved due to the fact that the photoelectric window blinds, which consist of a plurality of elongated lamellas arranged in parallel and connected between each other by at least two stripes, equipped with a drive for their assembling, disassembling and changing an inclination angle, which have solar panels mounted thereon, the panels are electrically connected between each other and equipped with a means for transmission of the obtained electric energy to external networks or storage means, according to the invention, each solar panel is formed by at least two sections of the solar elements arranged on a base made of an electrically insulating material. Therewith, the sections are covered with a temperature and moisture stable layer and are coupled to each other in a series or series-parallel fashion by a means of electric connection embedded therein, and are configured to receive at least one additional section. The edge section of each solar panel is equipped with a means for transformation of the output power, the means being a DC/DC transformer or a Schotky diode embedded into the base made of the electrically insulating material from a side of the panel faced towards the lamella, wherein the DC/DC transformers or Schotky diodes of each solar panel are coupled to a shared bus connected to a DC-to-AC current converter, thereby forming one active section of the solar element on each solar panel, the section being configured to be coupled to the means for transmission of the obtained electric energy connected to the DC-to-AC current converter.

A cross-section profile of the lamellas has a C-shape with curved edges, which form guides for mounting the solar panels in a longitudinal direction, wherein a distance between top and bottom edges of the sections of the solar elements of the solar panel and edges of the electrically insulating base equals to a width of the edges of the lamella guides, and a length of the electrically insulating base between terminal edges of the solar panel and edges of the corresponding sections of the solar elements does not exceed the length of said sections.

The assembly of each solar panel of at least two sections enables changing the length of the panel by increasing the number of sections and, as a consequence, the dimension of the blinds in a wide range, as well as parameters of voltage and current, which are sufficient both for the stable operation of the DC/DC transformer and for the Schotky diodes, and enables regulating a number of V at the output and is essential when coupling through the main bus to the DC-to-AC current converter, which are represented by standard inverters, in which there is a limitation of an input voltage parameter.

The arrangement of the sections on the base made of electrically insulating material followed by covering by the temperature and moisture stable layer provides a reliable protection of electric chains of a photosensitive layer of the solar element and increases a level of resistance of the panel as to environmental impacts in various climatic conditions.

Due to forming of one edge active section equipped with the means for transformation of the output power one each solar panel, it is enabled to direct the current from each panel of the photoelectric blinds towards the network and to increase the overall reliability of the system due to the fact that in case of failure of one of the solar sections and/or panels, the other ones will continue functioning, thereby directing the direct current towards the shared bus, while use of the DC/DC transformers or the Schotky diodes as the means for transformation of the output power will enable to avoid, to the fullest extent, a parasitic effect of movement of the generated solar energy from the illuminated panels to darkened portions of the panels, which are not affected by the solar beams, that will enable to obtain stable parameters of the electric energy with optimal voltage and current parameters for further transformation into the alternating one and transmission to the shared network with a possibility of satisfying the regulatory maximal level of a secure value of the electric voltage.

Use of the lamellas having the C-shaped profile, which have curved edges that form the guides for mounting the solar panels, while the width of said edges equals to the distance between the top and the bottom edges of the sections of the solar elements of the solar panel and the edges of the electrically insulating base, enables a quick mounting, high level of rigidity parameters of the blinds and effective usage of the area of the solar panel in order to collect the solar irradiation within the wide range of environmental impacts in various climatic zones.

According to one of the preferred embodiments, waterproof connectors of a plug-in type or conductors, which are coupled to contacts, which are arranged on a reverse side of the sections of the solar panels, are used as the means for electric connection of the sections of the solar elements. Such electric connection enables to perform quick and reliable mounting of the device within a wide range of dimensions of the window openings that is important in case of equipping the already built buildings with such devices.

As mentioned in a further embodiment of the invention, the solar panels are electrically connected between each other in a parallel fashion. Such connection is the optimal one when using both the DC/DC transformers and the Schotky diodes as the means for transformation of the output power.

The Schotky diodes will prevent an occurrence of parasite flows in case of failure of one of the solar panels or non-uniform illumination of the panels.

As mentioned in a further embodiment of the invention, the solar panels are electrically connected between each other in a series-parallel fashion that is optimal when using the Schotky diodes as the means for transformation of the output power, since they are a semiconductor diode having a small voltage drop and may be used to direct the current when dividing the system of the sections of the solar panel into groups. Furthermore, the series or series-parallel coupling between the sections with a possibility of coupling of at least one additional section thereto by the means for electrical connection embedded therein enables a quick mounting of the electric chains to transmit the obtained electric energy when forming the blinds having various dimensions. Therewith, parameters of the electric energy, which are generated by the lamellas, may be selected so as to provide minimal losses of the electric energy when transforming and transporting the same particularly within the given dimensions of the blinds.

As mentioned in a further embodiment of the invention, the DC/DC transformer increases and stabilizes the voltage within a range of from 24 to 36 V. As it has found during the development and testing the claimed invention, this particular voltage range enables to provide the required level of safety in case of mounting of the blinds on the buildings with higher requirements as to the electric safety.

According to a further embodiment of the invention, the sections of the solar elements have a rectangular shape with cut top corners, while the overall area of the sections of the solar elements has to be at least 0.7 of the overall area of the solar panel, and the length of the electrically insulating base between the terminal edges of the solar panel and the edges of the corresponding sections of the solar elements does not exceed the length of said sections. Such shape and dimension enable to use the area of the lamellas to the fullest possible extent and is effective in case of their possible equipment with additional sections, thereby enabling to electrically connect them without a risk of damaging the photoelectric elements.

Due to configuring the blinds drive with a possibility of changing the inclination angle of the lamellas as a function of the parameters of illumination inside and/or outside the room, it is enabled to provide a maximal balance for use of the blinds both for darkening the rooms and for collecting and accumulating the energy of the solar irradiation.

The combination of all features of the proposed invention enables to increase the functional area of each panel to the fullest possible extent, thereby minimizing a possibility of its curving, as well as to easily mount the blinds having individual dimensions in terms of the length and amounts of the lamellas, thereby providing a stable generation of the electric energy.

BRIEF DESCRIPTION OF THE DRAWINGS

The claimed invention is illustrated by an embodiment that follows and by the following drawings:

Figure 1:
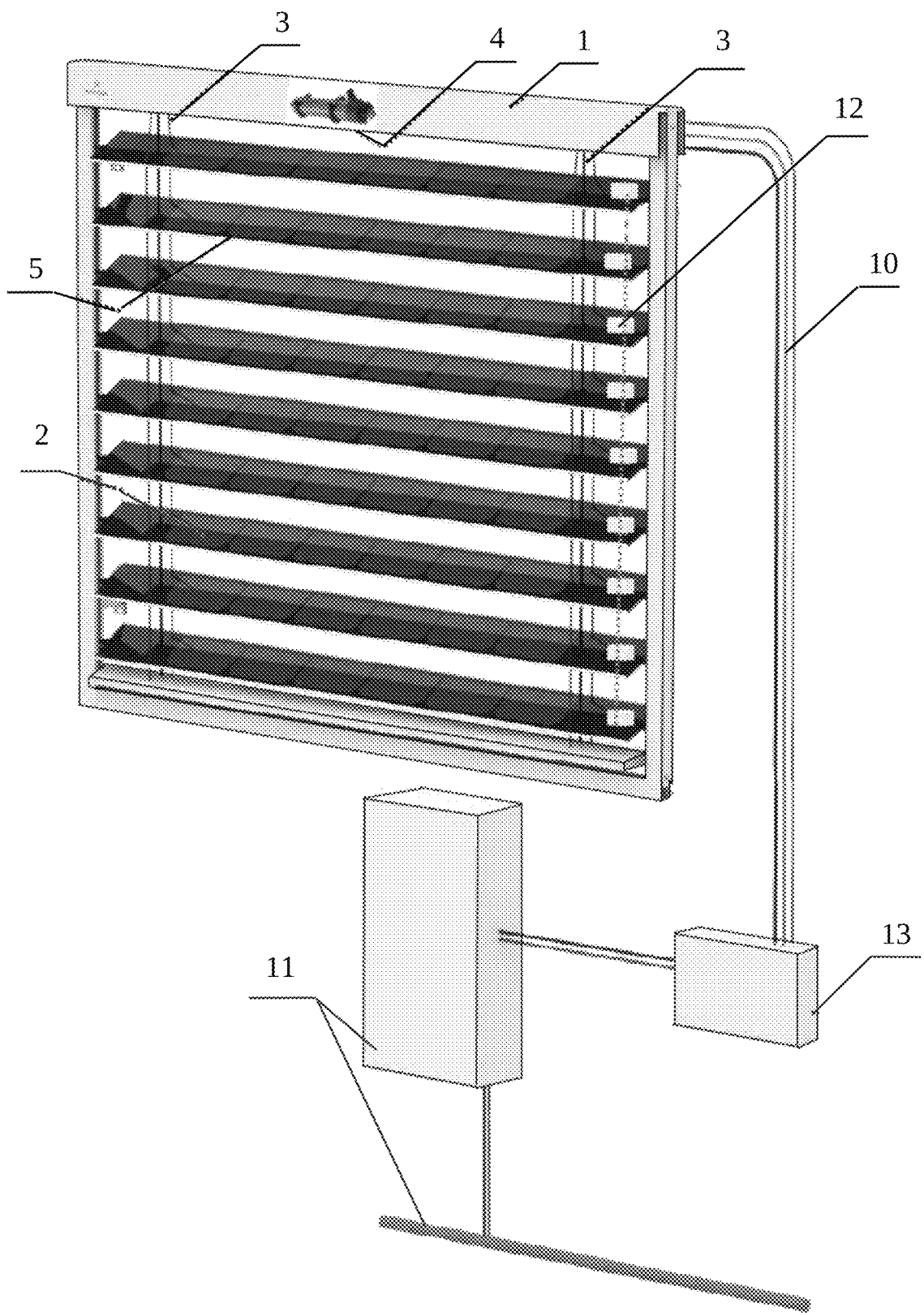
FIG. 1—an overall view of the photoelectric blinds.
Figure 2:
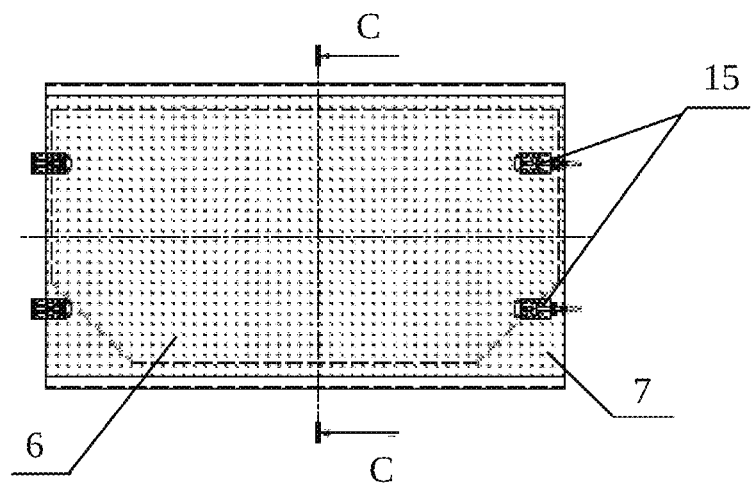
FIG. 2—a view of the section of the solar panel element.
Figure 3:
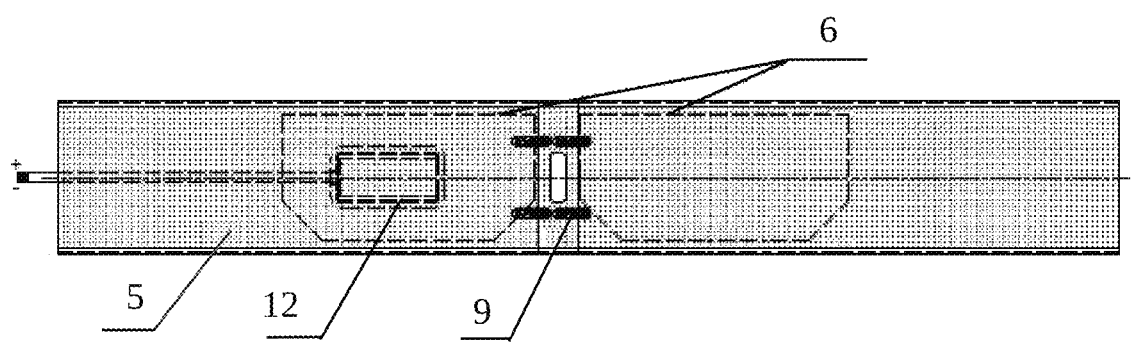
FIG. 3—a top view of the solar panel according to independent claim.
Figure 4:
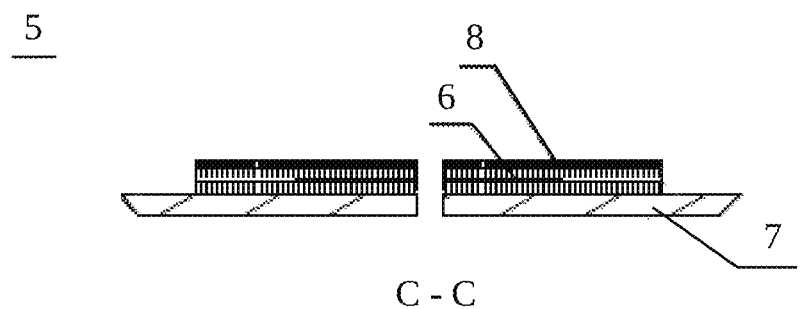
FIG. 4—a cross-section of the solar panel.
Figure 5:
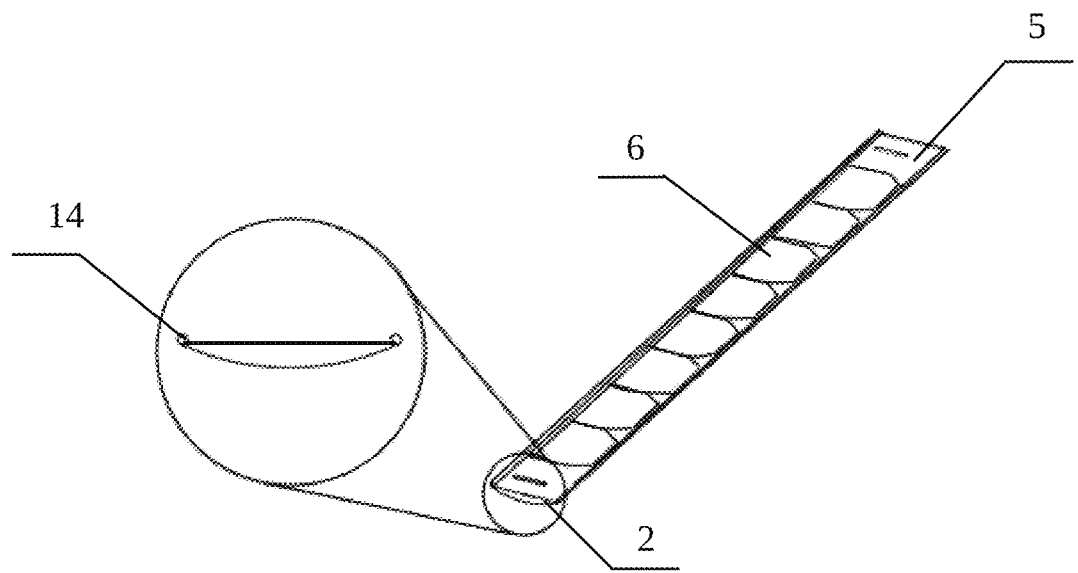
FIG. 5—a view of the solar panel having the C-shaped cross-section with the solar panel mounted, FIG. 6—a diagram of the blinds with the parallel electric connection of the solar panels, FIG. 7—a diagram of the blinds with the series-parallel electric connection of the solar panels.
Figure 6:
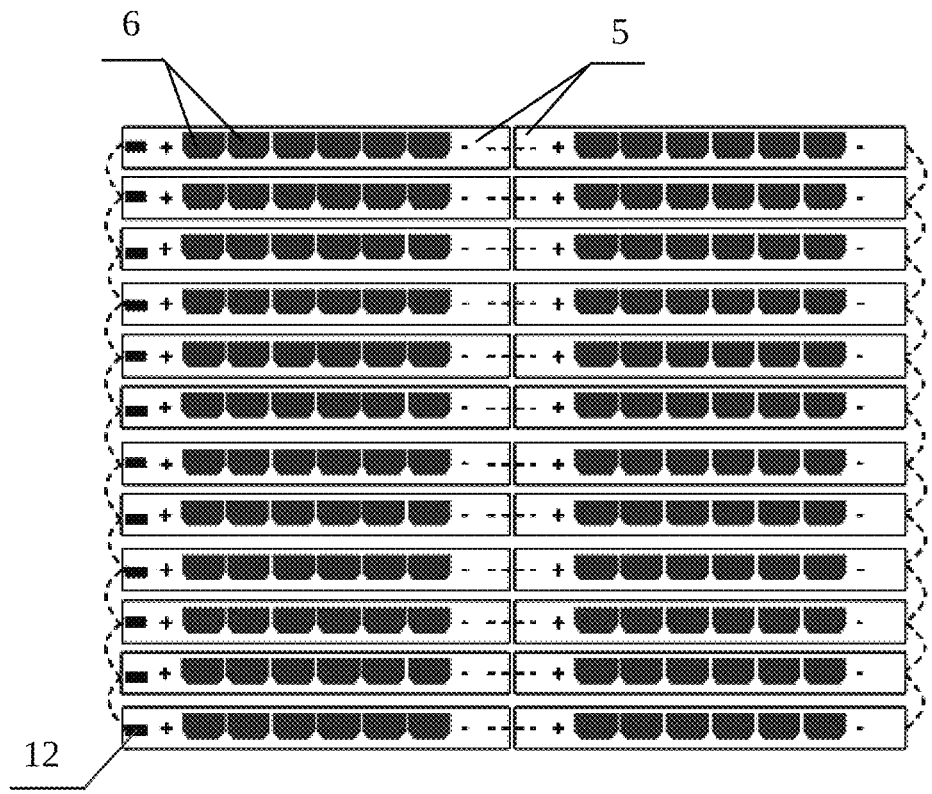
Figure 7:
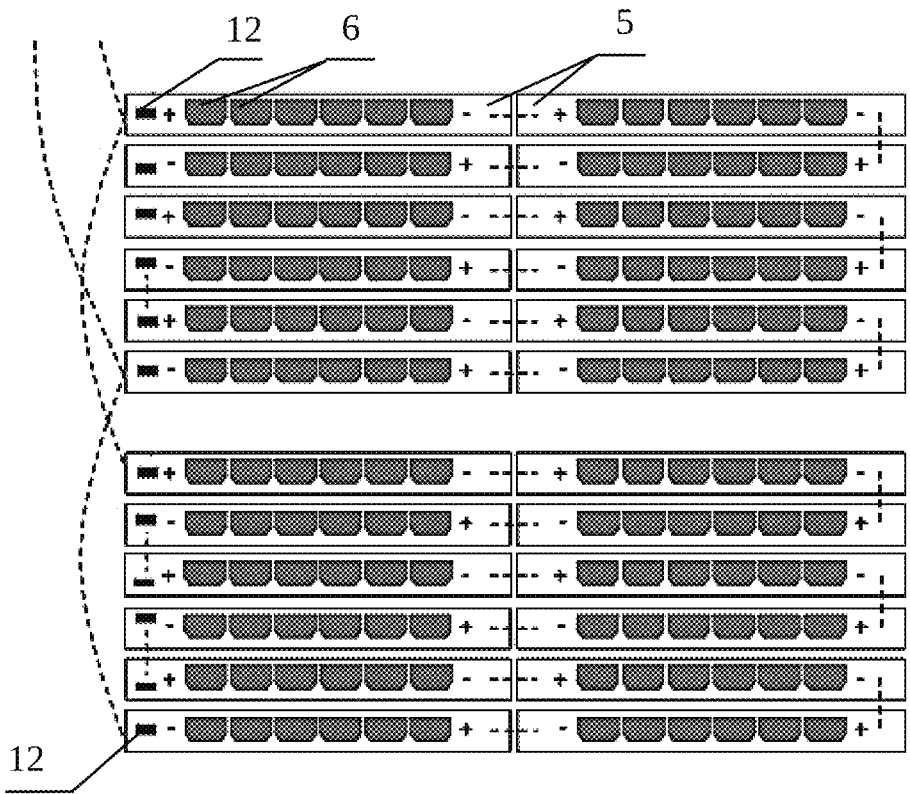

The illustrative drawings that illustrate the invention claimed as well as the mentioned particular embodiment of the photoelectric blinds are in no way intended to limit the scope of claims appended hereto but to explain the essence of the invention.

DETAILED DESCRIPTION OF THE EMBODIMENT OF THE INVENTION

In order for the invention and its advantages to be understood in a more full way, the below-mentioned description states an explanation of a possibility of implementation thereof with a reference to the drawings positions.

Photoelectric window blinds (1) consist of a plurality of elongated lamellas (2), which are arranged in parallel, connected between each other by at least two stripes (3) and equipped with a drive (4) for assembling-disassembling and changing an inclination angle. Solar panels (5) are mounted on the lamellas (2), each of the panels is formed by at least two sections (6) of solar elements made from photoelectric elements, e.g., thin-filmed sealed with an ethylene-vinyl-acetate film, arranged on a base (7) made from an electrically insulating material and covered by a temperature and moisture stable layer (8). The sections (6) of the solar elements are coupled to each other by a means (9) for electric connection embedded therein and are configured to couple at least one additional section. Therewith, all the solar panels (5) mounted in the lamella (2) are electrically connected between each other and equipped with a means (10) for transmission of the obtained electric energy to a means (11) for storage and/or external networks (11), and one edge section (6) of each of the solar panels (5) is provided with a means (12) for transformation of an output power that is a DC/DC transformer or a Schotky diode that is embedded into the base (7) from the electrically insulating material from the side of the panel (5) faced towards the lamella (2), wherein the DC/DC transformer or Schotky diodes of each solar panel are coupled to the means (10) for transmission of the obtained electric energy connected to a DC-to-AC current converter (13). Such design enables to reduce the losses on wires and to reduce the overall losses of the system.

A cross-section profile of the lamellas (2) has a C-shape with curved edges (14), which form guides for mounting the solar panels (5) in a longitudinal direction, wherein a distance between top and bottom edges of the sections (6) of the solar elements of the solar panel and edges of the electrically insulating base (7) equals to a width of the edges (14) of the lamella (2) guides.

The solar sections (6) are connected between each other to form the solar panels (5) by an electric connection by means of water-proof connectors (15) of a plug-in type, e.g., SMD Pin Connectors, or by means of conductors coupled to contacts, which are arranged at a reverse side of the sections (6) of the solar elements. Therewith, each solar panel (5) has a parallel or series-parallel connection with another one.

In order to use the area of the lamellas in the fullest possible extent and to assemble the sections (6) in the solar panel (5) in a more effective way, as well as to avoid deformation of their photoelectric covering, the sections of the solar elements are made in a form of rectangles having cut top corners. Therewith, the overall area of the sections (6) of the solar elements is at least 0.7 of the overall area of the solar panel (5), and the length of the electrically insulating base (7) between the terminal edges of the solar panel and the edges of the corresponding sections (6) of the solar elements does not exceed the length of said sections, which enables to reduce a non-functional area of the solar panel to the fullest possible extent and to predict a calibration zone for the possible coupling of additional sections (6) by preserving zones for the possible supplementation.

The drive (4) is configured to change the inclination angle of the lamellas as a function of parameters of illumination inside and/or outside the room. Due to configuring the blinds drive with a possibility of changing the inclination angle of the lamellas as a function of the parameters of illumination inside and/or outside the room, it is enabled to provide a maximal balance for use of the blinds both for darkening the rooms and for collecting and accumulating the energy of the solar irradiation.

Therefore, due to combination of said elements, their mechanical and electric interaction, the claimed invention enables to create a structure of the photoelectric blinds that is able to change the length of the panels easily, mounting of the blinds having individual dimensions for the already existing buildings with the effective use of the area of the lamellas to collect the solar irradiation by minimizing a possibility of deformation and mechanical damage of the solar panels and reducing a degree of non-functional zones, while providing the requirements as to the voltage value in the system for transformation of the current received from the panels and reduction of the current losses at the ways of its transportation to the shared network, and that is resistant to a wide range of environmental impacts that enables to use said blinds both inside and outside.

A technical effect being achieved lies in providing high characteristics of mechanical rigidity, while enabling to manufacture and easily mount the blinds in a wide range of dimensions, preserving an effective functional area for collection of the solar irradiation, reducing expenses for transformation and transportation of the electric energy to the shared network, while enabling to satisfy the requirements as to the electric safety in terms of the electric voltage value.

The invention claimed is:

1. Photoelectric window blinds, which consist of a plurality of elongated lamellas arranged in parallel and connected between each other by at least two stripes, equipped with a drive for their assembling, disassembling and changing an inclination angle, which have solar panels mounted thereon, the panels are electrically connected between each other and equipped with a means for transmission of the obtained electric energy to external networks or storage means, characterized in that each solar panel is formed by at least two sections of solar elements arranged on a base made of an electrically insulating material and covered with a temperature and moisture stable layer, coupled to each other by a means of electric connection embedded therein, and are configured to receive at least one additional section; one edge section of each solar panel is equipped with a means for transformation of the output power, the means being a DC/DC transformer or a Schottky diode embedded into the base made of the electrically insulating material from a side of the panel faced towards the lamella, wherein the DC/DC transformer or the Schottky diode of each solar panel is coupled to a shared bus connected to a DC-to-AC current converter; wherein a cross-section profile of the lamellas has a C-shape with curved edges, which form lamella guides for mounting the solar panels in a longitudinal direction, wherein a distance between edges of the sections of the solar elements of the solar panel and edges of the electrically insulating base equals to a width of the edges of the lamella guides.

2. The blinds according to claim 1, characterized in that water-proof connectors of a plug-in type are used as the means for electric connection of the sections of the solar elements.

3. The blinds according to claim 1, characterized in that conductors, which are coupled to contacts, which are arranged on a reverse side of the sections of the solar panels, are used as the means for electric connection of the sections of the solar elements.

4. The blinds according to claim 1, characterized in that the solar panels are electrically connected between each other in a parallel fashion.

5. The blinds according to claim 1, characterized in that the solar panels are electrically connected between each other in a series-Parallel fashion.

6. The blinds according to claim 1, characterized in that the DC/DC transformer increases and stabilizes the voltage within a range of from 24 to 36 V.

7. The blinds according to claim 1, characterized in that the sections of the solar elements are made in a form of rectangles with cut top corners and wherein the overall area of the sections of the solar elements is at least 0.7 of the overall area of the solar panel, and the length of the electrically insulating base between the terminal edges of the solar panel and the edges of the corresponding sections of the solar elements does not exceed the length of said sections.

8. The blinds according to claim 1, characterized in that the drive is configured to change the inclination angle of the lamellas as a function of parameters of an illumination inside and/or outside a room.

* * * * *